DISPOSABLE DIODE HOLDER

Filed Feb. 19, 1964

INVENTOR.
Martin Rabinowitz
by Greene and Durr
ATTORNEYS.

United States Patent Office 3,270,257

Patented August 30, 1966

3,270,257

DISPOSABLE DIODE HOLDER

Martin Rabinowitz, Ardsley, N.Y., assignor to Premier Microwave Corporation, Port Chester, N.Y., a corporation of New York Filed Feb. 19, 1964, Ser. No. 345,958

2 Claims. (Cl. 317—234)

This invention relates to a disposable microwave diode holder for easy assembly into, and easy removal from, a strip transmission line, specifically for use in a system at ultra-high and microwave frequencies.

A diode for use in systems of ultra-high and microwave frequencies is relatively small and has small axial terminal connections in the form of small pigtail wire leads or small narrow ribbon strips.

In order to connect such a diode electrically into the circuit and into the components with which the diode is to be used, the customary practice is to solder the pigtail wire terminals or the small narrow ribbon strips to the circuitry with which the diode will be used. Where such a diode is to be used with a stripline circuit, the soldering operation introduces some difficulty since the elements are generally confined in a small space into which it is not easy to introduce and manipulate soldering tools.

Such difficulty is aggravated when it becomes necessary to remove the diode, in case the diode has become defective while in service. In such case, in order to remove the diode, it must be unsoldered. Introducing a new diode in place of the discarded diode would again require a soldering operation, which is undesirable because a diode can be easily damaged unless it is handled properly. One of the difficulties is to keep the diode from being overheated by the high temperature required for the soldering operation.

Where such a soldering operation must be performed, advantages lie in performing such soldering operations at the place of manufacture, of the complete equipment in which the diode is assembled and utilized.

One object of the present invention is to permit the replacement of the defective diode in a simple manner that will eliminate the need for returning an apparatus to a manufacturer merely to replace a diode that has become defective in operation.

Another object of the invention is to provide a diode assembly, including a diode and a holder for the diode, that may be readily inserted and placed in operating position with respect to a stripline circuit, or readily removed from such operating position when a replacement is necessary, in a simple construction that may be easily and readily manipulated for placement in a circuit, or for removal from the circuit to permit a substitute or replacement diode to be placed in operative position.

The diode and its holder assembly may be easily and readily mounted in a microwave device, which may be a mixer, detector, multiplier, modulator, attenuator or switch, or the like.

In order that the handling of the diode itself may be reduced to a minimum, the diode leads are arranged to be soldered to two diametrically spaced areas that have been metallized on a dielectric annular support or holder for the diode. The diode holder assembly thus consists of the annular shaped dielectric holder, or support, with a relatively large central bore to accommodate the diode lengthwise along the maximum diameter of the bore, and with the leads of the diode soldered to two small diametrically opposite areas that have been metallized on one planar surface of the holder.

The holder and the diode may now be handled as a unit for placement in a properly arranged structure to place the two metallized areas of the holder in contact with two elements of the stripline circuit with which the diode is to be used.

Thus, the diode may be readily soldered to the holder with suitable safeguards at the factory, after which only the holder need be handled, and the diode is kept free from any physical forces that might otherwise affect its operativeness.

Since the diode operates in one direction only, as an electrical conducting device, safeguards must be provided to assure that a new diode, when assembled in the circuit as a substitute for a removed diode, will be oriented in the proper direction for the operation desired in the circuitry.

To provide such precaution for proper orientation of the diode, the diode when assembled and soldered onto the holder is disposed and oriented in a predetermined direction. The holder is then provided with suitable matching indicia to assure that the holder must and can be assembled in only one way, which will be to orient the diode in the proper direction when the holder is assembled in its package assembly with the remaining circuitry. Such marking indicia on the holder may be any devices that will require proper mating between an element on the diode holder and an element on the assembly package. In the present instance, the holder is provided with a hole in the annular ring that will fit over a properly positioned pin in the package assembly and is further provided with a niche in the external peripheral edge of the holder, thus assuring that the holder is in proper position to locate the diode in proper orientation when the holder is positioned on the pin and rotated with the niche engaging a suitable stop element which may be another pin. Obviously, any other equivalent elements may be employed that will require the holder to be properly assembled.

The details of construction of the diode holder, and its assembly in the circuitry package for connection in associated stripline circuit, are described in the following specification, taken in connection with the accompanying drawings, in which.

Figure 1:
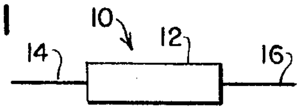
FIGURE 1 is a schematic symbol of a diode with ordinary pigtail leads.
Figure 1A:
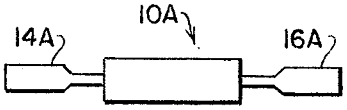
FIGURE 1A is a similar schematic figure showing the terminals of the diodes as flat ribbon strips.

As shown in FIGURE 1, a solid state diode 10 is shown as consisting of the solid state body 12 in relatively linear form, with the diode 10 having two coaxial wire leads 14 and 16 for connecting the diode into an external circuit. In FIGURE 1A the diode 10A is shown with two ribbon strips as terminals, identified as 14A and 16A.

Figure 1B:
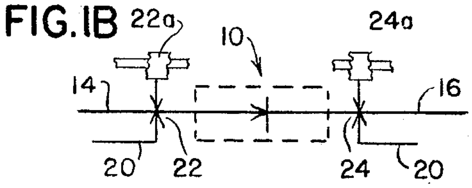
FIGURE 1B is a schematic circuitry diagram showing the manner in which the terminal leads of the diode may be suitably disposed between two spaced clamping elements.

In FIGURE 1B the diode 10 is shown symbolically with its two leads 14 and 16 shown connected to an external circuit 20 through two pressure type terminals 22 and 24, shown schematically with associated threaded pressure elements 22A and 24A.

The arrangement in FIGURE 1B is schematic. Actually, conventional practice has been to solder the terminals 14 and 16 of the diode 10 to the circuit elements 22 and 24 as parts of the main stripline circuit 20. Pressure terminal devices of the type indicated in FIGURE 1B as pressure elements 22 and 24 are actually not employed in microwave structures because of the lack of space. The showing in FIGURE 1B is intended to be symbolically functional.

In actual microwave devices, because of the relatively small spaces and small dimensions involved, the removal of a defective diode, while awkward, is not troublesome insofar as the unsoldering heating effect on the diode might be to damage it, since the diode is already in defective condition any stresses incidental to its removal would introduce no further hazard to the diode. However, the substitution of a good diode introduces a problem, because of the small space that is involved, and the consequent necessary handling of the diode body and the terminals, which might involve stresses, physical, thermal and mechanical, which could have a harmful effect on the diode in any manipulations required to insert the diode into operative condition with respect to the circuitry.

Figure 2:
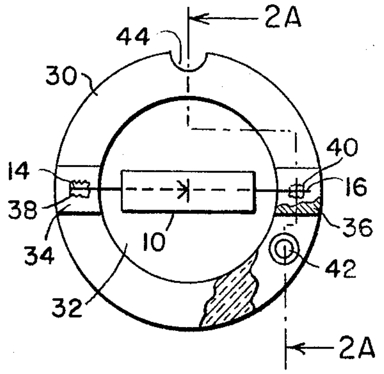
FIGURE 2 is a plan view of the diode, supported on its holder, shown with two diametrically spaced metallized areas.

To avoid any need for further handling of the diode itself, the diode 10, as shown in FIGURE 2, is mounted on an insulating support 30, in accordance with the present invention, so the support or holder 30 will take the brunt of all of the manual handling and temperature and pressure effects and stresses, without transmitting any such stresses onto the diode itself. The holder 30 is shown as consisting of an annulus 30 of dielectric material having a large open bore 32 to accommodate the diode 10, and having two surfaces 34 and 36 metallized to provide two electrically conductive areas, to which the diode leads 14 and 16 can be suitably soldered, as indicated by the two soldered areas 38 and 40.

When the diode 10 is assembled on the holder 30, the diode will always be assembled in the orientation indicated, so that the cathode will always be at one metallized area 36. Now, in order that the holder may be properly assembled in its associated structure so that the diode 10 will be properly connected to and inserted in the circuit, such as the circuit 20 in FIGURE 1B, with which the diode is to be used, the holder 30 is provided with two orienting or polarizing elements that will assure that the holder will always be positioned in the same direction when assembled in its associated structure.

Figure 2A:
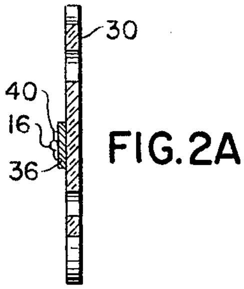
FIGURE 2A is a vertical sectional view taken along the line 2A—2A of FIGURE 2.

As shown in FIGURES 2 and 2A the annulus 30 is provided with a pin-receiving hole 42 in the body and a niche 44 on the outer peripheral edge of the holder. When the holder 30 with its supported diode 10 is placed in operative position in its structural assembly, the holder is arranged to be properly positioned by fitting the pin-receiving hole 42 over a stationary pin 70, after which the holder 30 is then angularly turned through a slight angle, as may be necessary, until the niche 44 of the holder engages a stop pin 72, as illustrated in more detail in FIGURE 4 below.

Figures 3, 4:
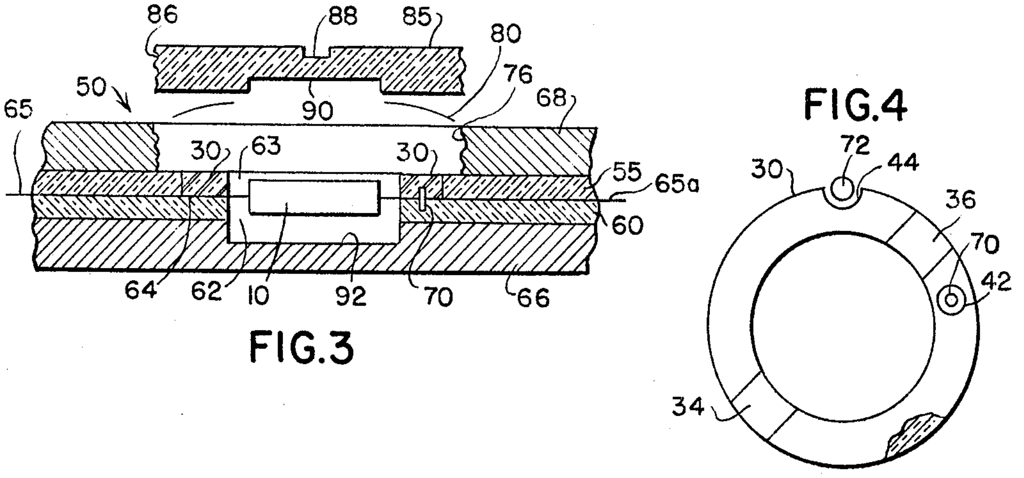
FIGURE 3 is an exploded vertical section through a circuit package assembly including a stripline circuit, in which the diode and its holder are shown assembled in operative position in series relationship with the stripline circuitry.
FIGURE 4 is a plan view of the holder and its positioning pins.

In FIGURE 3 is shown a schematic representation of a typical structure 50 in which a stripline conductor is utilized as the main circuitry element with which the diode 10 is to be associated. For simplicity of illustration, the structural assembly 50 is schematically and functionally illustrated as comprising an upper dielectric board 55, a lower dielectric board 60, with a stripline conductor 65–65A held in fixed position between the upper and lower dielectric boards 55 and 60, both of which are held in tightly pressed assembly by a bottom housing plate 66 and a top housing plate 68. The top housing plate 68 and the bottom housing plate 66 are suitably held together by external means not shown, depending upon the nature of the structural unit and the assembly illustrated here.

The bottom housing plate 66 is provided with a circular cavity 92. The lower dielectric board 60 is also provided with an opening 62 that is coaxial with and registers with the opening in the bottom housing plate 66. The upper board 55 has a co-axial opening 63 large enough to expose a border 64 around hole 62. The peripheral border 64 of the lower dielectric board immediately encircling the hole 62, serves as a shoulder or seat for the holder 30 for the diode 10. The stripline conductor 65, that is held in position between the upper and the lower dielectric boards 55 and 60, continues to, and terminates at, the edge of the circular opening 62 in the lower dielectric board 60. Thus, when the diode holder 30 is placed in proper position to rest coaxially on the shoulder 64 of the lower dielectric board 60, the two metallized areas 34 and 36 on the diametrically opposite sides of the holder 30 will be in proper position to rest on the terminating ends of the stripline conductor 65–65A on the shoulder or border 64 of the lower dielectric board 60. When the holder 30 is placed in such position and thus supported, the diode 10 will be insulatingly supported in the space defined as a well in the circular cavity 92 in the bottom housing plate 66 and in the two holes 62 and 63 in the lower and in the upper dielectric boards 60 and 55. The pin 70 is shown as being in position to protrude through the opening in the holder 30, so that the holder 30 must be properly located before it can be pressed home against stripline 65–65A, with the metallized sections 36 and 38, physically pressed against the terminating ends of the stripline 65–65A to establish electrical connection between the terminals 14 and 16 of the diode 10 and those two stripline sections 65 and 65A.

After the holder 30 is thus placed in proper position in the assembly of the structure, a resilient spring washer 80, is placed in position on top of the holder annulus 30 and a threaded crystal cap 85 is then threaded into a threaded opening 76 in the upper housing plate 68 and the cap is then threaded to impress sufficient pressure upon the spring washer 80 to assure adequate desired physical and electrical contact between the metallized areas on the holder 30 and the terminating edges of the stripline sections 65–65A.

So long as the diode is in satisfactory operating condition it is protected from any casual external forces. Upon the occurrence of any electrical condition that renders the diode inoperative and ineffective, the diode may then be readily removed from the assembly by the simple operation of unscrewing the cap 85, removing the spring washer 80, and then lifting the diode holder 30 entirely out of its contact with the stripline sections 65–65A. A new diode holder may then be readily dropped into position and assembled in the assembly structure with maximum ease, with a complete assurance that the diode is properly oriented, and is properly electrically connected to the stripline conductors to assure good contact with a minimum resistance.

Thus, by means of the construction shown, a defective diode may be readily removed in the field by an operator working with such sensitive equipment, and a substitute diode in proper working condition substituted without requiring any manual handling of the diode that might subject the diode to physical or temperature stresses that might or could affect the operativeness of the diode.

Thus, by means of the present invention, a defective diode may be readily removed from its assembly in a high frequency device that is otherwise of relatively small dimensions, and a good operative diode substituted without the hazard of subjecting the diode to any stresses or external conditions that would affect its operativeness while being handled and placed in the circuit.

The various details of the assembly and construction may be modified to meet various ambient structural or physical conditions, without departing from the spirit and scope of the invention as set forth in the appended claims.

I claim:

1. A microwave assembly including stripline circuitry and a diode, comprising a bottom housing plate of conducting material;

a lower dielectric board superposed on said housing plate and having a cavity formed in the upper surface of said board;

two stripline electrical conductors disposed on the upper surface of said dielectric board each having an end terminating respectively at a border area of said cavity on opposite sides of said cavity;

a dielectric annulus having a central bore and seated on said dielectric board with said central bore coaxially aligned with said cavity, said annulus also having two diametrically opposite areas metallized to be seated on and to electrically conductively engage the respective terminating ends of said stripline conductors;

a solid state diode having a body and two end terminals, with said end terminals electrically secured to said respective opposite metallized areas and with the body of the diode suspended from its two terminals in free space within the central bore of the annulus and the cavity of the lower dielectric board;

an upper dielectric board seated on the lower dielectric board to provide an insulating layer on said stripline conductors, said upper dielectric board having a hole therein to accommodate the annulus;

and means including an upper housing plate for compressing the upper and the lower dielectric boards to the lower housing plate, and for clamping the annulus in operative position against undesired physical displacement.

2. A microwave assembly, as in claim 1, in which said diode is oriented on said annulus for operation in a desired direction;

and said clamping means includes means for requiring proper orientation of said annulus in assembly to insure proper operation of the diode in its desired direction in the associated circuitry.

References Cited by the Examiner

UNITED STATES PATENTS

| | | | |
|---|---|---|---|
| 2,798,013 | 7/1957 | Irmler | 317—234 X |
| 2,880,383 | 3/1959 | Taylor | 29—25.3 |
| 2,959,718 | 11/1960 | Kadelburg | 317—234 |
| 2,999,964 | 9/1961 | Glickman | 317—234 |

JOHN W. HUCKERT, *Primary Examiner.*

D. O. KRAFT, J. D. CRAIG, *Assistant Examiners.*